United States Patent [19]

Rose

[11] Patent Number: 5,510,074
[45] Date of Patent: Apr. 23, 1996

[54] METHOD FOR MANUFACTURING SMART CARDS

[75] Inventor: Rene Rose, Voisin-le-Bretonneux, France

[73] Assignee: Schlumberger Industries, Montrouge, France

[21] Appl. No.: 200,632

[22] Filed: Feb. 23, 1994

[30] Foreign Application Priority Data

Feb. 23, 1993 [FR] France ................ 93 02059

[51] Int. Cl.⁶ ................ B29C 45/14; B29C 45/16
[52] U.S. Cl. ................ 264/261; 264/511; 264/263; 264/272.15; 264/272.17; 264/275; 264/294
[58] Field of Search ................ 264/272.15, 272.17, 264/511, 259, 261, 263, 275, 278, 294, 328.7, 328.8, 271.1; 425/129.1, 121

[56] References Cited

U.S. PATENT DOCUMENTS

| | | | |
|---|---|---|---|
| 3,320,345 | 5/1967 | Lirdnes | 264/279 |
| 4,625,102 | 11/1986 | Rebjock et al. | 235/492 |
| 4,737,620 | 4/1988 | Mollet et al. | |
| 4,792,843 | 12/1988 | Haghiri-Tehrani et al. | 357/72 |
| 4,810,444 | 3/1989 | Alberino et al. | 264/328.7 |
| 4,961,893 | 10/1990 | Rose | 264/272.15 |
| 5,030,309 | 7/1991 | Brignet et al. | |
| 5,030,407 | 7/1991 | Mollet et al. | 264/275 |
| 5,164,144 | 11/1992 | Rose | |
| 5,340,528 | 8/1994 | Machida et al. | 264/328.7 |
| 5,350,553 | 9/1994 | Gläser et al. | 264/272.15 |

FOREIGN PATENT DOCUMENTS

| | | |
|---|---|---|
| 0128822 | 12/1982 | European Pat. Off. |
| 0071255 | 2/1983 | European Pat. Off. |
| 0197847 | 10/1986 | European Pat. Off. |
| 0267826 | 5/1988 | European Pat. Off. |
| 0340099 | 11/1989 | European Pat. Off. |
| 0449691 | 2/1991 | European Pat. Off. |
| 0488485 | 6/1992 | European Pat. Off. |
| 2622323 | 4/1989 | France |
| 2650530 | 2/1991 | France |
| WO8912871 | 12/1989 | WIPO |

Primary Examiner—Jan H. Silbaugh
Assistant Examiner—Angela Ortiz
Attorney, Agent, or Firm—Frishauf, Holtz, Goodman, Langer & Chick

[57] ABSTRACT

A smart card is made of a thermoplastic material card body having two substantially parallel major sides. A support member with a graphic on it is on at least one side of the card. An electronic module has a contact array to one side of which is fixed a chip including an integrated circuit. The support member is placed in a mold comprising an hollow space defining the shape of the card and delimited by two main walls corresponding to the major sides of the card, and it is held against one of these main walls. A thermoplastic material is injected into the volume defined by the hollow space to fill the volume not occupied by the support member. The electronic module is placed at an appropriate position in the hollow space before the injected material has solidified completely.

10 Claims, 4 Drawing Sheets

METHOD FOR MANUFACTURING SMART CARDS

FIELD OF THE INVENTION

The present invention concerns a method of manufacturing smart cards, an apparatus for implementing the method and cards manufactured using the method and the apparatus. Smart cards are molded from a thermoplastic material. They usually comprise two parts, namely a card body with a printed graphic and an electronic module comprising a contact array and a chip containing an integrated circuit. In the usual methods the card body is machined to receive the electronic module.

BACKGROUND OF THE INVENTION

Smart cards hold data for using services, such as prepaid telephone call charge units, for example. ISO Standard 7810 imposes strict constraints and specifications on the size, mechanical strength and reliability of these electronic cards. One important aspect is the mechanical strength of the card, i.e. its ability to withstand the stresses to which it is subjected and which may damage it, to the extent of ripping out the integrated circuit chip, for example.

Manufacturing the cards is made all the more difficult by their small size, especially their thickness (0.8 mm).

One of the major problems with manufacturing smart cards is fastening the module to the card body.

Prior art cards are molded, as described in the applicant's U.S. Pat. No. 5,164,144, for example, using a mold having a hollow space defining the exterior shape of the card body and delimited by two main walls corresponding to the two major sides of the card. In this implementation, the smart cards comprise three components, namely a card body, a support member having a graphic on at least one side and an electronic module. A support member having a graphic on at least one side is placed in said mold and held against a first wall of the hollow space. A thermoplastic material is injected into the mold to fill all of the volume delimited by the hollow space not occupied by the support member. The card body with the support member carrying the graphic attached to it is then removed from the mold.

A recess is formed on the opposite major side of the card body to that carrying the support member to enable insertion of the electronic module when molding the card body. The shape of the recess is complementary to that of the electronic module.

The electronic module is inserted and fixed to the card body by a prior art method such as that disclosed in U.S. Pat. No. 4,737,620, for example. This document discloses a process in which pegs or projections in the recess receiving the electronic module are heated to a temperature at which they soften and the module is pressed down to flatten the tips of the pegs or projections until the module reaches the correct position, i.e. until the contact arrays are substantially coplanar with the respective major side of the card body. Fastening of the module to the card body is completed by injecting an insulative adhesive between the back of the recess and the electronic module.

Another prior art method for inserting and fixing an electronic module into a smart card is described in U.S. Pat. No. 4,625,102. In this prior art method, the electronic module is placed on a flat-ended tool associated with heating means. The module is pressed into the correct position due to the combined effect of pressure and localized heating. The plastics material of the card body flows when the electronic module is pressed in and fills a hole through the module with a flared end whereby the material filling the hole acts as rivets.

Published European patent application No. 449691 discloses a method of fixing an electronic module to a card body in which a stamping tool with multiple spikes is dipped into a container of adhesive so that droplets of the adhesive form at the ends of the spikes and are transferred to the card body when the tool is applied to it. The cavity receiving the electronic module is staggered in the sense that it has a smaller lower housing and a larger upper housing opening onto the upper surface of the card body. The edge of the bottom of the upper housing therefore forms a shoulder parallel to the upper surface of the card body. The droplets of adhesive are deposited onto this shoulder. When the spiked tool is applied to this shoulder the droplets at the ends of the spikes remain on the surface of the shoulder 20 because of the different surface tensions of the materials of the spikes and the card body. The next step is to place the electronic module in the cavity and to polymerise the adhesive. In this well-known process, the adhesive is preferably a cyano-acrylate adhesive.

These prior art methods are satisfactory for fixing the graphic support member to the card body. However, they are open to improvement in respect of fitting the electronic module and fastening it to the card body.

In the above-described approaches, the support member and the electronic module are fitted to the card body in two separate and successive operations. Also, fitting the module by virtue of partial softening of the card body is relatively difficult. Furthermore, adhesives and resins like epoxy resin used to fix the electronic module to the card body are subject to shrinkage, admittedly slight but nevertheless sufficient to compromise the relative positions of the module and the card body. If the electronic module is fitted by one of the prior art methods it can be removed from the card body and fixed to another. The method of the present invention is such that the module cannot be removed without destroying it.

SUMMARY OF THE INVENTION

An object of the invention is to provide a method and apparatus for manufacturing smart cards which improve on the performance of prior art approaches, especially with regard to the simplicity, cost and reliability of the connection between the electronic module and the card body, for security reasons.

These and other objects of the invention are attained by a method of manufacturing a smart card having a thermoplastic material card body with two substantially parallel major sides, a support member with a graphic on at least one side, and an electronic module comprising a contact array to one side of which is fixed a chip including an integrated circuit. The method includes the step of placing the support member in a mold comprising a hollow space which defines the volume and shape of the card and that is delimited by two main walls corresponding to the major sides of the card. The card is held against a first main wall of the mold, and a thermoplastic material is injected into the volume defined by the hollow space to fill that portion of the volume not occupied by the support member. The electronic module is inserted at an appropriate position in the hollow space before the injected material has solidified completely.

The electronic module is preferably accommodated in a cavity which opens into the second wall of the mold in such a way as to communicate with the hollow space. The electronic module is moved between a first position in which it is retracted so as to not project beyond the second wall of the mold, and a second position in which the electronic module is in an extended position. The electronic module is inserted into the thermoplastic material under pressure.

The respective materials of the card body and the electronic module are advantageously such that, in the liquid state, intermolecular chemical bonds are formed due to temperature and pressure.

The card body material is Acrilonitrile-Butadiene-Styrene (ABS), for example, and the electronic module material is polyamide (PA) or polybutyleneteraphtalate (PBT). Alternatively, the card body material is polycarbonate (PC) and the electronic module material is PC, PA or PBT.

In a preferred embodiment of the invention, the electronic module is inserted after a time lapse from injection of the material into the hollow space of less than one second and preferably between 0.1 and 0.5 secs.

Another aspect of the invention is directed to an apparatus for manufacturing a smart card which includes a card body made of a thermoplastic material having two substantially parallel major sides. A support member has a graphic on at least one side thereof. An electronic module comprises a contact array to one side of which is fixed a chip including an integrated circuit. A mold has a hollow space defining the shape of the card and is delimited by two main walls corresponding to the major sides of the card. Means dispose and hold the support member against a first main wall of the mold. A liquid or viscous thermoplastic material is injected into the volume defined by the hollow space to fill the volume not occupied by the support member. The electronic module is inserted into the hollow space and held therein before the thermoplastic material has solidified completely.

The means for inserting the electronic module preferably comprise a piston movable within the cavity from a first position in which the module is retracted into the cavity to a second position in which the module is disposed in the hollow space of the mold so that the upper surface of the module is flush with the respective major side of the card body.

BRIEF DESCRIPTION OF THE DRAWINGS

The invention will be clearly understood from the following description given by way of illustrative example with reference to the accompanying drawings in which.

DETAILED DESCRIPTION OF THE PREFERRED EMBODIMENTS

Figure 1A:
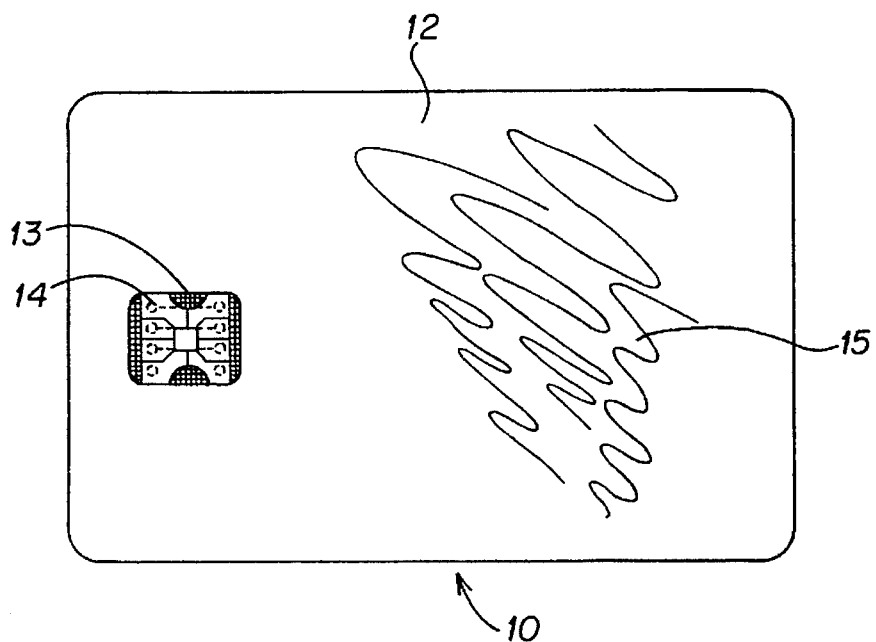
FIGS. 1A and 1B are diagrammatic front views of smart cards which comply with the ISO and AFNOR standards, respectively.
Figure 1B:
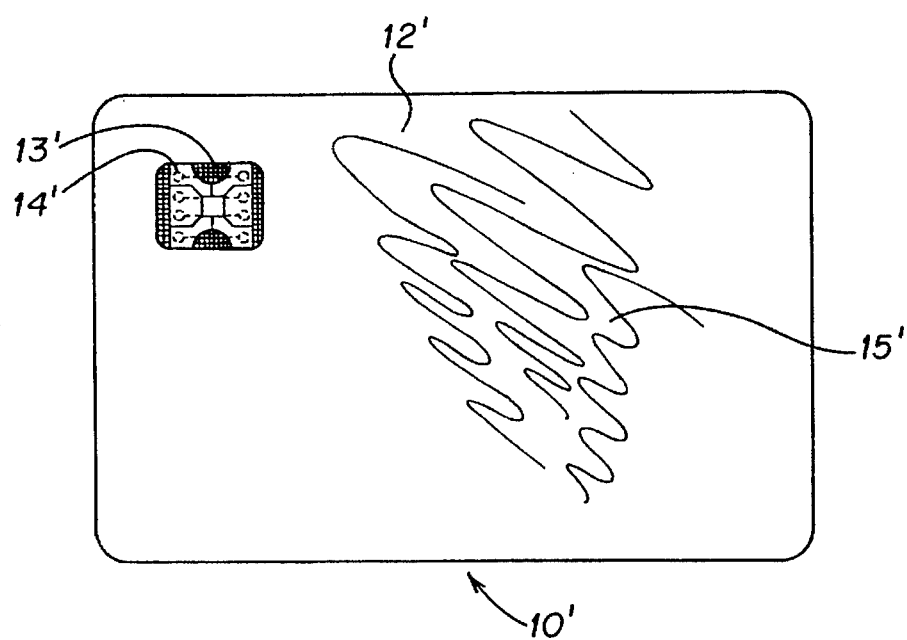

The description refers initially to FIG. 1A. Items in FIG. 1B identical or similar to items in FIG. 1A carry the same reference numbers primed ('). FIGS. 1A and 1B differ in respect of the position of the electronic module according to the International Standards Organization standard and the association Française de Normalisation standard.

FIG. 1A is a plan view of a prior art smart card 10 having a card body 12 whose overall shape is that of a rectangular parallelepiped. The card 10 is to the ISO 7810 standard and is therefore 85 mm long, 54 mm wide and 0.8 mm thick. The card body includes an opening 13 through which can be seen an electrical contact array 14 with eight contacts, for example. They are adapted to make contact with a data reading device (not shown) associated with the card and used to retrieve data from the card relating to services available to the holder and user of the smart card 10. The electrical contacts 14 also conform to the ISO 7810 standard mentioned above.

Card 10 has two major sides of which the front side is shown in FIG. 1A. The card carries a graphic 15, an illustrative example of which is shown in FIG. 1A. The graphic could, of course, be any text or design. In this example, the graphic is on the back of the card, the material of which is transparent.

Inside the card body is an electronic module adapted to enable data to be exchanged between the card and the associated device. The electronic module has a contact array 14 and an integrated circuit connected to the contact array 14.

Figure 2:
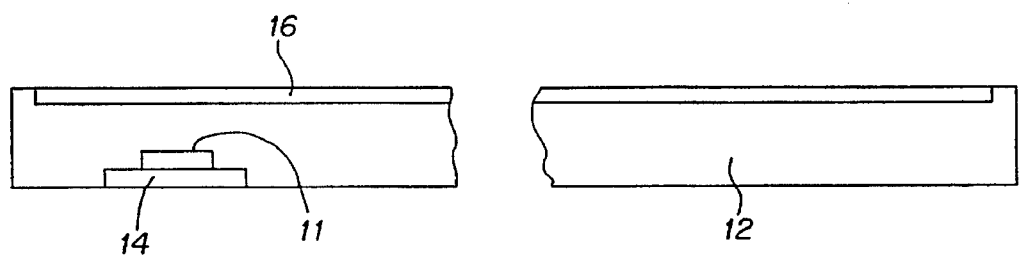
FIG. 2 shows a card from FIG. 1A or 1B in transverse cross-section.

FIG. 2 shows the card of FIG. 1 in transverse cross-section and to a larger scale. Card body 12 includes the electronic module incorporating the contact array 14, the integrated circuit enclosed in a chip 11 and a label 16 carrying the graphic 15. The label 16 is known in itself and may be any kind of support member, made from a cellulose-based material, for example. The method of producing these labels is known in itself and might use, for example, an opaque material support strip which is offset, photogravure or silkscreen printed and then cut to the exact size of the respective major side of the card. In the FIG. 5 embodiment, the label is smaller than the card body 12.

The card body 12 is made from a thermoplastic material the technical specifications of which conform to the ISO 7810 standard already mentioned, especially its bending and strength specifications.

For more information on the card, which is known in itself, reference may be had U.S. Pat. No. 5,164,144 which is incorporated herein by reference. U.S. Pat. No. 5,057,460 and U.S. Pat. No. 4,625,102 describe the electronic module and the method of manufacturing it and are incorporated herein by reference.

The method of the invention and the apparatus for implementing it are described next with reference to FIGS. 3 and 4.

The method produces a smart card as described above by injection molding using a molding apparatus described below with reference to FIG. 3.

The molding apparatus 20, referred to hereinafter for simplicity as the mold, comprises a fixed part 21 and a moving part 22. The latter can be pressed against the fixed part 21. In this closed position of the mold, the fixed and moving parts define a hollow space 23 of generally parallelepiped shape matching the exact shape of the smart card to be made.

The main wall 24 of the moving part 22 and the main wall 25 of the fixed part 21 respectively correspond to the front and back major sides of the card.

When the mold is closed with the moving part 22 pressed against the fixed part 21, the distance between the main walls 24 and 25 corresponds to the thickness of the card (0.8 mm according to the ISO standard). The length and width of the hollow space 23 also conform to the ISO 7810 standard. The dimensions of the hollow space are slightly larger to allow for shrinkage of the thermoplastic material.

In the moving part 22 of the mold 20 is a cavity 26 opening onto the main wall 24 and, therefore, communicating with the hollow space 23 when the mold is closed. The cavity is generally cylindrical and a moving assembly 27 can move inside it along the longitudinal axis of the cylindrical cavity 26. The moving assembly 27 includes a cylindrical shaft 28 connected to known motive means such as a hydraulic ram (not shown) and a rectangular plate 29 fixed to the end of shaft 28 where the orifice of the cavity 26 opens onto the main wall 24. The electronic module has a contact array 30 and a part including an integrated circuit connected to the contact array 30. It can be fastened to the plate 29. The part 31 including the integrated circuit is usually called the chip. The electronic module comprising the contact array 30 and the chip 31 is held onto the plate 29 by suction. Pipes 32 and 33 open onto the upper surface of the plate 29 and are connected at the end opposite the electronic module to a main suction pipe 34 connected to known suction means (not shown). The respective dimensions of the moving plate 29 and the contact array 30 are substantially the same and the contact array 30 therefore covers virtually all of the front surface of the plate 29 (parallel to the main wall 24). The dimension of the plate 29 transversely to the longitudinal axis of the cavity 26 is substantially equal to (to be more specific very slightly less than) the inside dimensions of the cavity 26. The electronic module is known in itself and could be of the type described in above-mentioned U.S. Pat. No. 4,625,102, for example. In brief, the contact array 30 is stamped out of thin metal strip bent into a three-decker configuration. The shaped strip is placed in a mold into which a thermoplastic material is injected and whose hollow space defines the outside shape of the module. The mold has protective arrangements to prevent the molding material from being deposited onto the contact arrays and the fixing areas of the integrated circuit chip. Additional details are provided in above-mentioned U.S. Pat. No. 5,625,102.

The method of injection molding the card body is described next with reference to FIGS. 3 and 4A, 4B and 4C.

Figure 3:
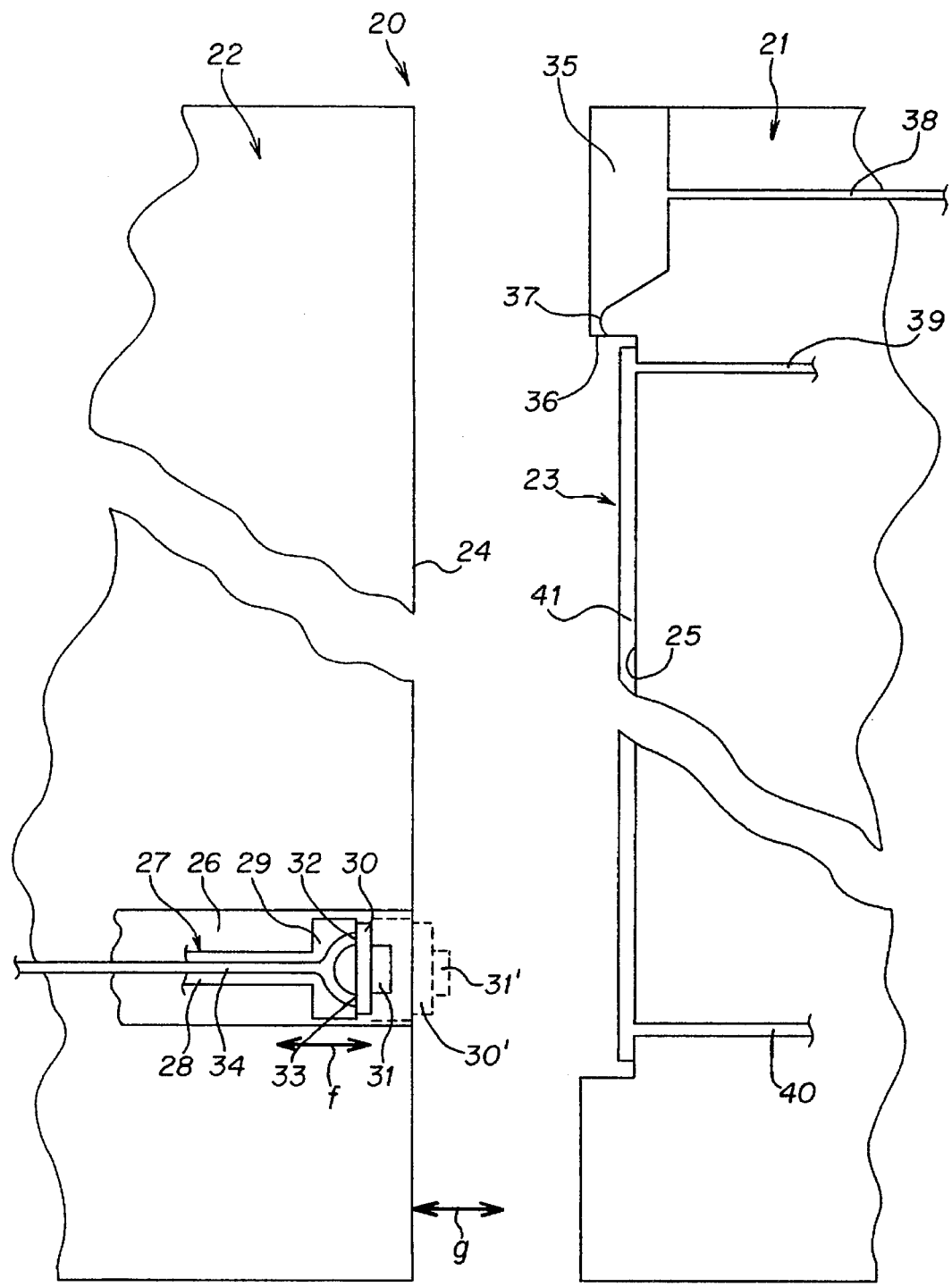
FIG. 3 is a diagrammatic transverse cross-section through a molding apparatus for manufacturing a card.

As shown in FIG. 3, the fixed part 21 of the mold 20 includes an injection chamber 35 to one side of the hollow space 23 and communicating with it via a generally rectangular opening 36 opening onto a side of the hollow space 23 transverse to the main wall 25 of said hollow space. The injection chamber 35 has a narrowed part 37 near the opening 36. It is connected to a source of heated thermoplastic material under pressure via an injection passage 38 (these arrangements are not shown as they are well known).

The fixed part 21 of the mold 20 further includes suction pipes 39 and 40 discharging onto the main wall 25 inside the hollow space 23. The suction pipes 39 and 40 are connected to known suction means (not shown).

The manufacturing process is described next with reference to FIGS. 4A, 4B and 4C which each show a different position of the moving part 22 of the mold and the piston 27 carrying the electronic module 30/31.

Figures 4A, 4B, 4C:
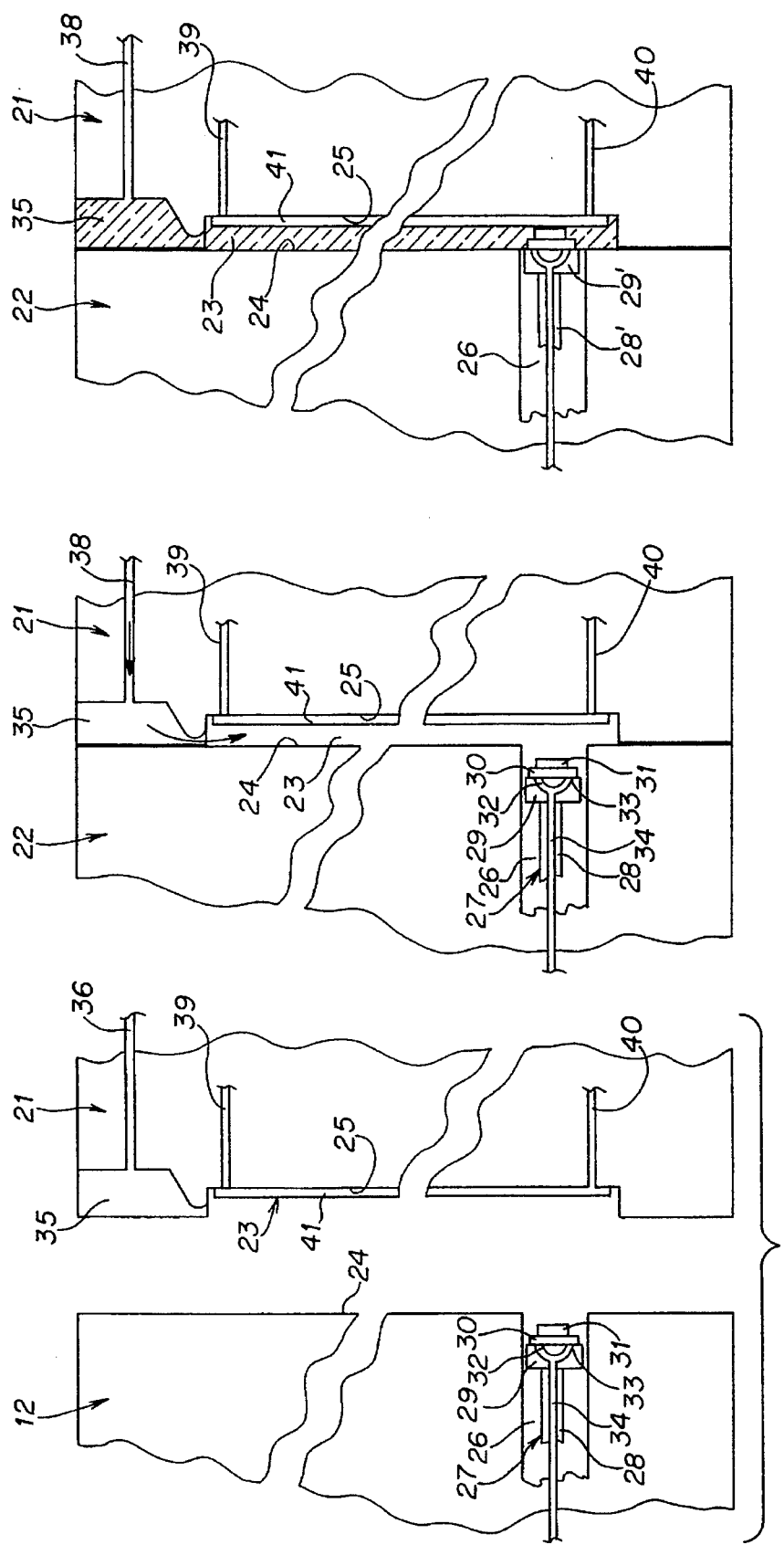
FIGS. 4A, 4B and 4C show the molding apparatus of FIG. 3 to a smaller scale for three respective positions of the mold and the module corresponding to three successive stages of the method.

FIG. 4A shows the first step with the moving part 22 moved away from the fixed part 21 and the shaft 28 carrying the electronic module retracted inside the cavity 26. The electronic module is, therefore, inside the cavity and, in any event, does not project beyond the main wall 24 of the moving part 22. A support member 41 carrying a graphic is placed flat against the main wall 25 of the fixed part 21. The support member (referred to hereafter as the graphic) is held against the main wall 25 by suction as a result of connecting the suction pipes 39 and 40 to the suction system.

Referring to FIG. 4B, the moving part 22 of the mold is moved in translation until the main wall 24 abuts against the fixed part 21 of the mold. The hollow space 23 then defines a closed volume delimited by the main walls 24 and 25. In this position, the shaft 28 carrying the electronic module 30/31 is still retracted inside the cavity 26 in the moving part 22.

In the position shown in FIG. 4B, a liquid thermoplastic material is injected under pressure through the injection passage 38 to fill the injection chamber 35 from whence it flows via the narrowed part 37 and the opening 36 into the volume delimited by the hollow space 23 not occupied by the graphic 41. Because of the high pressure to which the material is subjected (around 150 bars) and the small volume of the hollow space, the latter is filled with the thermoplastic material which forms the card body in a relatively short time, less than one second, for example.

When the filling of the hollow space has begun, and preferably immediately as it is begun, the shaft 28 is moved to the position 28' in which the electronic module 30/31 enters the hollow space 23 with the side of the contact arrays 30 opposite the chip 31 flush with the main wall 24. In other words, the relevant side of the contact arrays 30 is flush with the major side of the card body being made (FIG. 4C).

The electronic module 30/31 is inserted a very short time after injection begins of the thermoplastic material into the hollow space, which is typically about a few tenths of a second. This time lapse depends on a number of parameters of which the most important are the nature of the thermoplastic material, especially its viscosity, and the geometry and volume of the mold.

Given the short time between the moment at which the thermoplastic material fills or virtually fills the hollow space 23 and the time at which the electronic module 30/31 is moved into the hollow space 23, the module pushes back the viscous thermoplastic material and becomes embedded in it. All other things being equal, this time lapse is determined to allow the electronic module to enter the hollow space filled with the thermoplastic material before the latter solidifies.

The insertion of the electronic module solves the problems associated with the prior art because said module is inserted during molding of the card body which simplifies manufacture of the card and positions said module correctly relative to the card body.

The travel and the pressure of the shaft 28 carrying the electronic module are controlled in such a way that the latter enters the material at the right time and is positioned within the card body without impeding its formation.

The cavity 26 is in the moving part 22 of the mold, on the side opposite the injection chamber 35 in the plane of the card body. This has the additional advantage that the time lapse required between starting injection and inserting the electronic module by moving the latter into the cavity 26 can be controlled more precisely. The time available for inserting the module before the material solidifies completely is directly proportional to the distance between the module and the orifice 36 for injecting the material.

Figure 5:
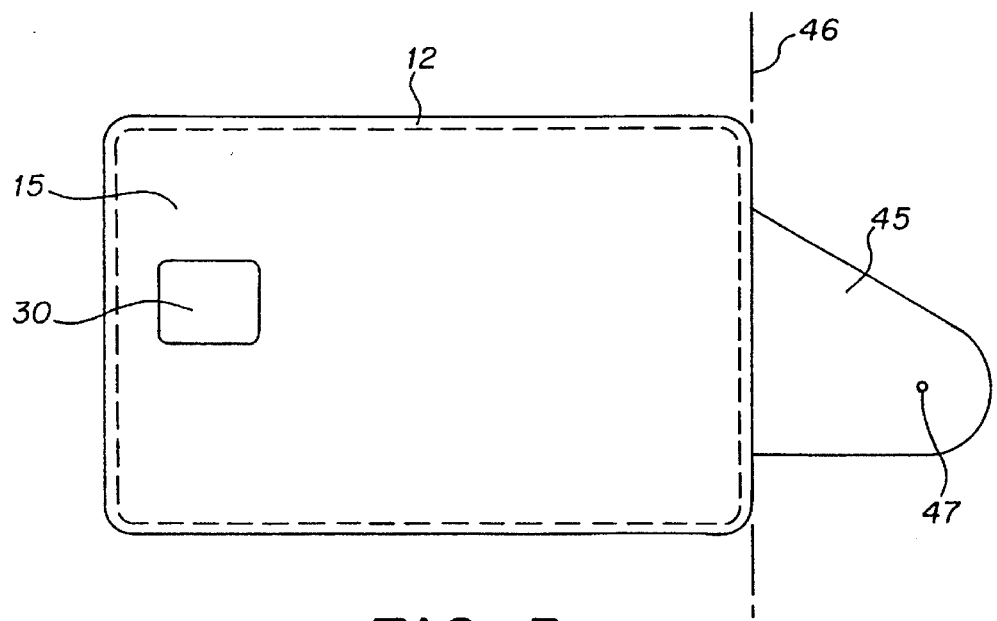
FIG. 5 shows the smart card removed from the mold at the outlet from the apparatus of FIG. 3.

When molding is finished, the connection between the main suction passage 34 (in the shaft 28) and the suction system is broken and the moving part 22 of the mold is moved away from the fixed part 21. The card is then removed from the mold and is as shown in FIG. 5 where it can be seen that the card body 12 associated with the graphic support member 15 and the contact array 30 is fastened to a mass of solidified thermoplastic material 45 made up of the volume of material that fills the injection chamber 35. The line 46 is a symbolic representation of the opening 36 from the injection chamber into the hollow space 23. The point 47 is where the injection passage 38 discharges into the injection chamber 35. Starting from the assembly shown in FIG. 5, the final step is to separate the injection stalk (the mass 45) from the card body as such.

A second aspect of the invention achieves further advantages by using a specific thermoplastic material for the card body and the electronic module, as described below.

The applicant has discovered that with some materials a weld-like bond is obtained between the card body and the electronic module. The method as described above and these materials produce intermolecular chemical bonds exploiting active sites of the liquid material and the solid surface of the respective materials of the card body and the electronic module.

This is extremely advantageous because the attachment of the module to the card body is strengthened which enhances the reliability and the mechanical strength of the smart card manufactured this way.

The applicant has carried out tests and trials with the following materials:

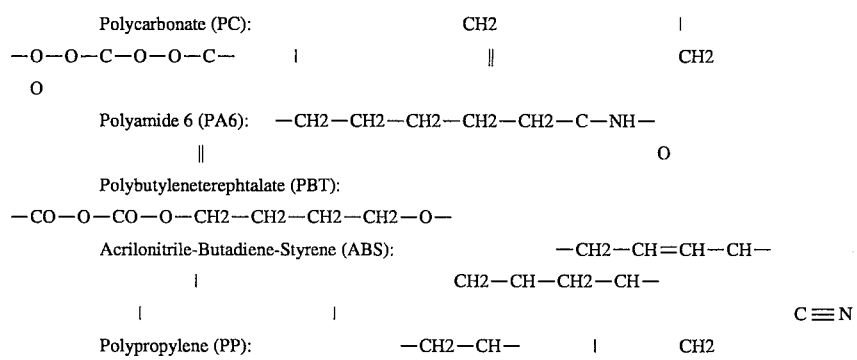

The table below summarizes the tests carried out by the applicant with various combinations of materials for the card body and the electronic module, the materials being identified by their initials as used above.

| CARD BODY | MODULE | | | |
|---|---|---|---|---|
| | PC | PA | PBT | PP |
| ABS | YES | YES | YES | NO |
| PC | YES | YES | YES | NO |

The use of polycarbonate (PC) is explained in more detail below. This material is an amorphous polymer comprising benzene rings and C=O groups which are highly reactive and can therefore create intermolecular bonds, which are favored by the amorphous state of the material.

The following are three kinds of bonds:

(1) between two benzene rings, (2) between two C=O groups, and (3) between a benzene ring and a C=O group, or There are a multiplicity of potential chemical bonds between two molecules of this material. The PC card body and module are strongly bonded once the module has been inserted into the material of the card body by the method described above.

Other materials tested and listed above confirm that any material having benzene rings and/or C=O groups can form intermolecular chemical bonds and, therefore, achieve strong attachment of the module to the card body. Tests also confirm that polypropylene (PP) cannot produce such intermolecular bonds.

The invention is not limited to the embodiment described but encompasses any variant as indicated in the following claims.

I claim:

1. Method of manufacturing a smart card having a thermoplastic material card body with substantially parallel major sides; a support member with a graphic on at least one side; and an electronic module comprising a contact array to one side of which is fixed a chip including an integrated circuit, comprising the steps of:

placing said support member in a mold comprising a hollow space defining volume and shape of said card and delimited by first and second main walls corresponding to the major sides of said card;

holding said support member against said first main wall of said mold;

injecting a thermoplastic material into the volume defined by said hollow space to fill that portion of said volume not occupied by said support member; and then inserting said electronic module at an appropriate position in said thermoplastic material before said injected material has solidified completely.

2. Method according to claim 1, further comprising the steps of accommodating said electronic module in a cavity which opens into said second main wall of the mold in such a way as to communicate with said hollow space, and moving said module from a first position in which it is retracted and does not project beyond said second wall of the mold to a second position in which said electronic module is in an extended position.

3. Method according to claim 1 wherein said electronic module is inserted under pressure.

4. Method according to claim 1 wherein the respective materials of said card body and said electronic module are such that, in the liquid or viscous state, due to temperature and pressure, when the electronic module is inserted, intermolecular chemical bonds are formed between the material of the card body and the material of the electronic module.

5. Method according to claim 4 wherein the card body material is acrilonitrile-butadiene-styrene (ABS) and the electronic module material is polyamide (PA) or polybutyleneteraphtalate (PBT).

6. Method according to claim 4 wherein the card body material is polycarbonate (PC) and the electronic module material is the same material or polyamide or polybutyleneteraphtalate (PBT).

7. Method according to claim 4 wherein the respective materials of said card body and said electronic module comprise benzene rings.

8. Method according to claim 1 wherein said electronic module is inserted in said hollow space after a time lapse from injection of the material into the hollow space of less than one second.

9. Method according to claim 4 wherein the respective materials of said card body and said electronic module comprise —C=CO groups.

10. Method according to claim 8 wherein said electronic module is inserted in said hollow space after a time lapse from injection of the material into the hollow space of between 0.1 and 0.5 seconds.

* * * * *